United States Patent
Schneiker et al.

(10) Patent No.: US 6,943,356 B2
(45) Date of Patent: Sep. 13, 2005

(54) TIP FOR NANOSCANNING ELECTRON MICROSCOPE

(75) Inventors: Conrad W. Schneiker, Tucson, AZ (US); Robert Gray, Rochester, NY (US)

(73) Assignee: Biomed Solutions, LLC, West Henrietta, NY (US)

(*) Notice: Subject to any disclaimer, the term of this patent is extended or adjusted under 35 U.S.C. 154(b) by 251 days.

(21) Appl. No.: 10/615,452

(22) Filed: Jul. 8, 2003

(65) Prior Publication Data

US 2004/0079892 A1 Apr. 29, 2004

Related U.S. Application Data

(63) Continuation-in-part of application No. 10/042,795, filed on Jan. 9, 2002, now Pat. No. 6,700,127.
(60) Provisional application No. 60/394,379, filed on Jul. 8, 2002.

(51) Int. Cl.[7] .............................................. H01J 37/073
(52) U.S. Cl. .............................. 250/423 F; 250/442.11
(58) Field of Search ...................................... 250/423 F

(56) References Cited

U.S. PATENT DOCUMENTS 5,587,586 A * 12/1996 Kruit ....................... 250/423 F
2003/0143453 A1 * 7/2003 Ren et al. ..................... 429/40

* cited by examiner

Primary Examiner—John R. Lee
Assistant Examiner—James J. Leybourne
(74) Attorney, Agent, or Firm—John M. Hammond; Howard J. Greenwald P.C.

(57) ABSTRACT

An apparatus for producing an electron beam, comprising a support structure; a miniature ultrahigh vacuum chamber comprising a superconducting single walled metallic-type carbon nanotube comprised of a cylindrical wall, a proximal end disposed upon and sealed to the support structure, and a distal end comprising an electron-transparent structure; an electron beam emitting tip comprising a second carbon nanotube embedded in the support structure and disposed within the superconducting single walled metallic-type carbon nanotube, the second carbon nanotube having an inner surface with a thin conductive coating disposed thereupon; and means for creating an electrical potential difference the electron beam emitting tip and the cylindrical wall of said superconducting carbon nanotube. There is also provided a scanning electron microscope comprising an enclosed point source electron beam generator disposed within a conically tapered enclosure having a proximal end and a distal end, the proximal end in communication through an opening therein with a vacuum tube, and the distal end comprising a conical pipette tip target opening.

20 Claims, 12 Drawing Sheets

TIP FOR NANOSCANNING ELECTRON MICROSCOPE

CROSS-REFERENCE TO RELATED PATENT APPLICATIONS

This application is a continuation-in-part of application Ser. No. 10/042,795 filed Jan. 9, 2002, now U.S. Pat. No. 6,700,127, and further claims the benefit of the filing date of U.S. provisional patent application Ser. No. 60/394,379, filed Jul. 8, 2002.

This invention relates in one embodiment to an improved microscopy probe comprising a carbon-based nanotube having a nanometer scale tip disposed within a first vacuum chamber.

FIELD OF THE INVENTION

Probes and tips made of nanoscale material structures, used in electron microscopy.

BACKGROUND OF THE INVENTION

Many analytical devices, such as electron microscopes, are used to image the topography and surface properties of a substrate. These devices utilize a focused beam of electrons to illuminate a substrate. Sources of these electron beams are often contained in the tips of the analytical device.

Electron point sources, which may be utilized in these analytical devices, are well known. These electron point sources, often on the order of the atomic scale and adapted to provide field emission of coherent electron beams, have been described in, e.g., "Coherent point source electron beams", Hans-Werner Fink, Werner Stocker, and Heinz Schmid, Journal of Vacuum Science and Technology B, Volume 8, Number 6, November/December 1990, pp. 1323–1324, in "Unraveling nanotubes: field emission from an atomic wire," A. G. Rinzler, J. H. Hafner, P. Nikolaev, L. Lou, S. G. Kim, D. Tomanek, P. Nordlander, D. T. Colbert and R. E. Smalley, Science, 269, pp. 1550–1553 (1995), and in "Carbon nanotubes are coherent electron sources", Heinz Schmid, Hans-Werner Fink, Applied Physics Letters, Volume 70, Number 20, 19 May 1997, pp. 2679–2680. The first reference discloses a tungsten tip terminated with an atomically perfect pyramid of tungsten atoms as the electron emitter. The second and third references disclose a carbon nanotube as the electron emitter.

By way of further illustration, U.S. Pat. No. 5,654,548 ("Source for intense coherent electron pulses") discloses how such sources can be used for one type of electron microscopy. The entire disclosure of this U.S. patents is hereby incorporated by reference into this specification.

Electron beams have been used in constructing microscopes. For example, U.S. Pat. No. 6,005,247 (Electron beam microscope using electron beam patterns) discloses "An electron beam microscope includes an electron beam pattern source, a vacuum enclosure, electron optics, a detector and a processor." U.S. Pat. No. 6,043,491 (Scanning electron microscope) discloses "A scanning electron microscope in the present invention, by employing a retarding method and suppressing interferences between an electron beam and secondary electrons or back scattered electrons, makes it possible to obtain a clearer SEM image with a higher resolution." The entire disclosure of each of these United States patents is hereby incorporated by reference into this specification.

Field emitted electron beams are also useful in many types of vacuum microelectronic devices, as described in "Vacuum Microelectronics," edited by Wei Zhu, (John Wiley & Sons, New York, 2001).

Fabrication of specialized tips used in scanning electron microscopes and atomic force microscopes is well known to those skilled in the arts. For example, U.S. Pat. No. 6,020,677 (Carbon cone and carbon whisker field emitters) discloses "Carbon cone and carbon whisker field emitters are disclosed. These field emitters find particular usefulness in field emitter cathodes and display panels utilizing said cathodes." U.S. Pat. No. 5,393,647 (Method of making super hard tips for micro-probe microscopy and field emission) discloses "Forming micro-probe tips for an atomic force microscope, a scanning tunneling microscope, a beam electron emission microscope, or for field emission, by first thinning a tip of a first material, such as silicon." The entire disclosure of each of these United States patents is hereby incorporated by reference into this specification.

As used herein, the term "nanotube" refers to a hollow structure having a diameter of from about 0.3 to about 10 nanometers, and a length of from about 3 to about 10,000 nanometers. In general, such nanotubes have aspect ratios of at least about 1:10 to about 1:1000. Carbon-based nanotubes are hollow structures composed between 95-to 100% of carbon atoms. In general, the most commonly studied forms of nanotubes have physical properties such that they conduct electricity better than copper. Typically, carbon nanotubes have tensile strength 100 times that of steel. Carbon nanotubes become superconductors at very low temperatures. Nanotubes can be fabricated from materials other than carbon, e.g., MoS2, Tungsten disulphide, Molybdenum disulphide, and Boron nitride. Carbon nanotubes may be capped with metallic cores. Carbon nanotubes can be doped with other elements, e.g. metals. Carbon-based nanotubes can be either single-walled nanotubes (SWNT) or multi-walled nanotubes (MWNT). A MWNT includes several nanotubes each having a different diameter. Thus, the smallest diameter nanotube is encapsulated by a larger diameter nanotube, which in turn, is encapsulated by another larger diameter nanotube.

The prior art sources of atomic point source electron beam emitters typically must be operated at very low pressures, on the order of about $10^{-8}$ to $10^{-10}$ Torr, to protect them from disruptive contamination, chemical degradation, beam scattering or destructive ion bombardment by residual gas ions. This often requires the use of complicated, expensive, and cumbersome equipment.

It is an object of this invention to provide a device, which allows electron beam point sources to be utilized with samples maintained at pressures in a wide range of vacuums from about atmospheric pressure to $10^{-10}$ Torr. The mechanically protective ultra high vacuum enclosure of these delicate electron beam point sources in conjunction with the exceptionally good electron-optical qualities of such sources makes possible very small source to target distances, ranging from about 1 centimeter to 10 nanometers. This in turn reduces vacuum requirements needed for practical application of such electron beams, including scanning electron microscopy. It is another object of this invention to provide an improved carbon-based tip for scanning probe microscopy.

SUMMARY OF THE INVENTION

In accordance with the present invention, there is provided an apparatus for producing an electron beam, comprising a support structure; a miniature ultrahigh vacuum chamber comprising a superconducting single walled metallic-type carbon nanotube comprised of a cylindrical wall, a proximal end disposed upon and sealed to said support structure, and a distal end comprising an electron-transparent structure; an electron beam emitting tip comprising a second carbon nanotube embedded in said support structure and disposed within said superconducting single walled metallic-type carbon nanotube, said second carbon nanotube having an inner surface with a thin conductive coating disposed thereupon; and means for creating an electrical potential difference between said electron beam emitting tip and said cylindrical wall of said superconducting carbon nanotube.

In accordance with the present invention, there is further provided a scanning electron microscope comprising an enclosed point source electron beam generator disposed within a conically tapered enclosure having a proximal end and a distal end, said proximal end in communication through an opening therein with a vacuum tube, and said distal end comprising a conical pipette tip target opening.

BRIEF DESCRIPTION OF THE DRAWINGS

The invention will be described by reference to the following drawings, in which like numerals refer to like elements, and in which.

Figure 1:
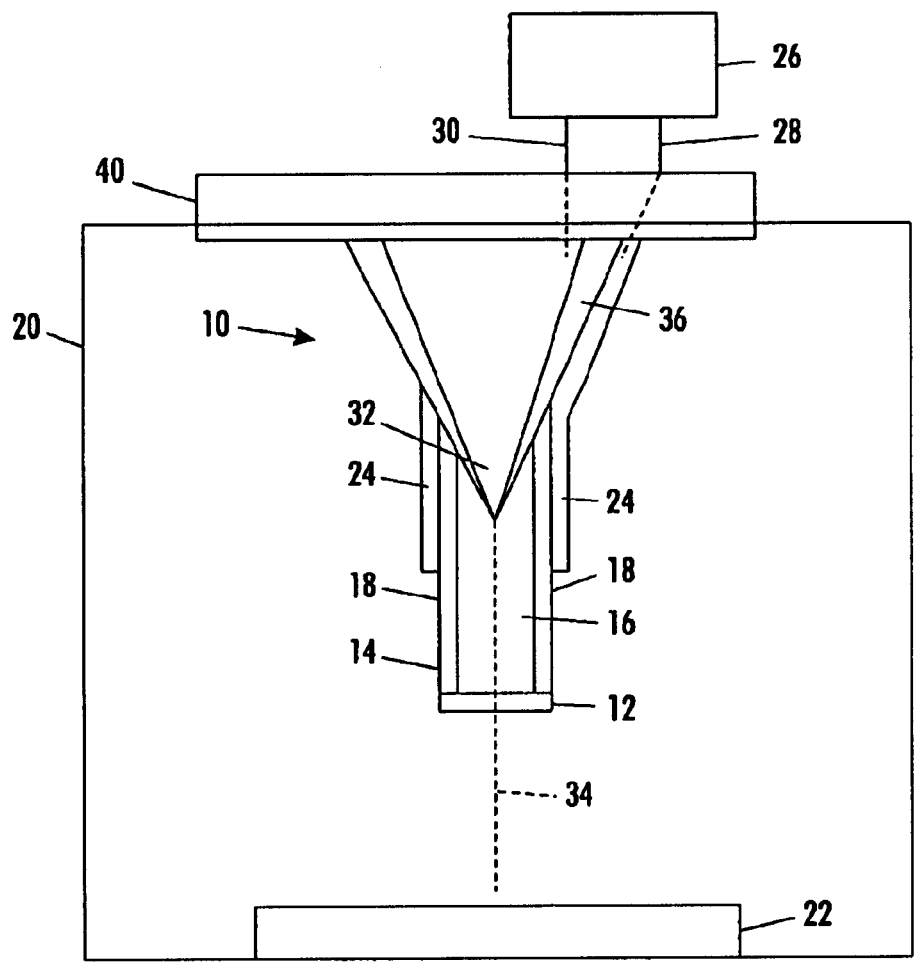
FIG. 1 is a schematic representation of an enclosed point source electron beam generator.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENTS

For a general understanding of the present invention, reference is made to the drawings. In the drawings, like reference numerals have been used throughout to designate identical elements.

Atomic scale point source electron beams have many potential advantages for scanning electron microscopy, including higher resolution at lower voltages in much more compact configurations; these electron beam sources also are advantageously used in vacuum microelectronic devices fabrication and testing. The primary disadvantage is the requirement for operation at ultra-high vacuum when used as electron field emitters to avoid damage by ion bombardment. By using a miniature ultra-high vacuum chamber to permanently enclose the field emission part, the vacuum requirements for the rest of a scanning electron microscope can be greatly relaxed, leading to major operational and economic advantages, and a much wider range of practical application of this uniquely advantageous point source of coherent electron beams.

In one embodiment, the invention of this patent application comprises the structure and utilization of a monoatomic tip in place of conventional field emission sources, providing a far superior initial electron beam in terms of narrow beam divergence and narrow energy spread and greatly reducing the requirements for high beam voltages and expensive electron optical systems needed for very high resolution imaging.

The enclosed point source electron beam generator described in this specification may operate with a miniature ultra-high vacuum enclosure with an electron-transparent window. This enables the rest of the system to be operated under more conventional vacuum conditions. The rest of the system may comprise conventional or, due to the very narrow electron beam sources produced at relatively low voltages, greatly miniaturized versions of conventional scanning electron microscopes, scanning transmission microscopes, point projection Fresnel microscopes, electron beam lithography systems, and vacuum microelectronic devices.

An alternative means of generating very fine electron beams at low voltages (about 50 to 500 volts) from a conventional electron beam and coupling it to a superconducting nano-channel is also disclosed. Such beams can be used for the microscopy systems and vacuum microelectronic devices. Very fine electron beams from any of the above sources may be guided and/or manipulated by superconducting nano-channels.

As is known to those in the field of electron beam technology, suitably oriented magnetic fields may be used to confine electron beams for some distance once they have been suitably created and formed. The small size of the electron beam source of this invention and the ability to position it close to the ultimate target makes it feasible to wholly immerse the entire source-to-target system in the bore of a powerful magnetic field generating system whose internal magnetic field is oriented parallel to the main electron beam axis. The magnetic field system, depending on system size and performance requirements, may employ permanent magnets or conventional electromagnets or superconducting electromagnets, optionally augmented with magnetic pole pieces, following common practices well known to those in the art. Immersing the entire system in this magnetic field has the net effect of causing electrons that would normally radially diverge from the main beam axis to instead spiral around it. For scanning electron microscopy or scanning electron beam surface modification applications, either the source or target would need to be mechanically scanned relative to the other. Such scanning may for instance be implemented by any of the lateral electro-mechanical scanning techniques that are used for scanning tunneling microscopes or atomic force microscopes, following common practices well known to those in the field.

In the remainder of this specification reference will be made to the use of single walled superconducting carbon nanotubes. However, it is to be understood that multi-walled superconducting carbon nanotubes may be utilized as well, as may be any other essentially atomically perfect nanotube structure, which, if not naturally superconducting, may be optionally externally coated with a thin film of superconducting material.

In the preferred embodiment illustrated in FIG. 1, there is illustrated a tip assembly 10 comprised of a high quality electron-transparent thin wall 12 positioned at the distal end 14 of an ultra-high vacuum chamber 16. The thin wall 12 is electron-transparent, i.e., electron beams may be passed through it without significant dispersion or attenuation, relative to the intended application. Electron beam transparency is a function of electron energy and the type and thickness of the thin wall material. Using means well known to those skilled in the art, the initial electron beam energy would be set for attaining an acceptable level of electron beam transparency for a particular thin wall material, and then, if needed, the electron beam energy would subsequently be raised or lowered as appropriate for the intended application.

Electron-transparent thin-walls and structures and materials comprising them are well known to those skilled in the art. Reference may be had, e.g., to U.S. Pat. No. 6,300,631 (Method of thinning an electron transparent thin film membrane on a TEM grid using a focused ion beam), U.S. Pat. No. 6,194,720 (Preparation of transmission electron microscope samples), U.S. Pat. Nos. 6,188,068, 6,140,652, 6,100,639, 6,060,839, 5,986,264, 5,940,678 (electronic transparent samples), U.S. Pat. Nos. 5,633,502, 4,680,467, 3,780,334 (Vacuum tube for generating a wide beam of fast electrons), and the like. The entire disclosure of each of these United States patents is hereby incorporated by reference into this specification.

Referring again to FIG. 1, and in the embodiment depicted, wall 12 is preferably a film that preferably has a thickness of from about 1 to about 50 nanometers. In one preferred embodiment, film 12 consists essentially of silicon nitride, boron nitride, or diamond.

The wall 12, in combination with wall 18, defines a chamber 16. The vacuum within chamber 16 is preferably greater than about $10^{-7}$ Torr. In one aspect of this embodiment, the vacuum within chamber 16 is from about $10^{-7}$ to about $10^{31\ 10}$ Torr.

The vacuum within chamber 16 may be created by conventional means. In one embodiment, (not shown) the tip assembly 10 is placed within an ultra high vacuum chamber (not shown) during its manufacturing assembly process and chamber 16 is vacuum sealed to the electron transparent wall 12 thus enclosing an ultra high vacuum within chamber 16.

The chamber 16 has a relatively small volume, of preferably less than about 1 cubic millimeter. In one embodiment, the chamber 16 has a volume of less than about 0.1 cubic millimeters.

Referring again to FIG. 1, it will be seen that the tip assembly 10 is utilized within a sample vacuum chamber 20 whose volume may be at least about 1,000 times as great as the volume of chamber 16. However, the vacuum in chamber 20 may be substantially lower than the vacuum in chamber 16. The pressure in chamber 20 is typically at least about 10 to 1,000 times as great as the pressure within chamber 16.

Referring again to FIG. 1, and in the preferred embodiment depicted therein, the tip assembly 10 is disposed above sample 22 and can be moved, by means described elsewhere in this specification, so that it is closer to or further away from sample 22.

Referring again to FIG. 1, and in the preferred embodiment depicted therein, an extraction electrode assembly 24 is preferably disposed around chamber 16. Electrode assembly 24 is electrically connected to external voltage supply 26 by means of conductors 28 and 30.

In another embodiment, not shown, the extraction electrode assembly 24 is disposed within chamber 24.

In one embodiment, the extraction electrode assembly 24 is electrically charged to an electrical potential typically in the range of from about 50 to about 500 volts with respect to the field emission tip 32 (which is the mono-atomic point source of electron beam 34).

In the embodiment depicted in FIG. 1; tip assembly 10 may comprise either a single or multi walled carbon nanotube 32 or a tungsten mono-atomic point emitter (not shown). Reference may be had to U.S. Pat. No. 6,159,742 (Nanometer-scale microscopy probes), U.S. Pat. No. 4,939,363 (Scanning tunneling microscope), and the like. The entire disclosure of each of these U.S. patents is hereby incorporated by reference into this specification.

The extraction electrode assembly 24 may optionally be fashioned from a superconducting material to take advantage of the Meissner effect for narrowing the emission cone of electrons from the emitter due to the superconducting material's expulsion and thus confinement of the magnetic fields of the emerging electrons. The Meissner effect is the ability of a material in a superconducting state to expel all magnetic fields therefrom (i.e., such a superconductor is perfectly diamagnetic and exhibits a permeability of zero). Reference may be had, e.g., to U.S. Pat. No. 4,975,669 (Magnetic bottle employing Meissner effect). The entire disclosure of this U.S. patent is hereby incorporated by reference into this specification.

Referring again to FIG. 1, and in the preferred embodiment depicted therein, the emission tip 32 is attached to an electrically insulating tip enclosure 36 to isolate the tip 32 from electrode 24. An electrical connection is made from the voltage source 26 to the electrode 24 by means of conductor 28. An electrical connection is made from the voltage source 26 to the tip 32 by means of conductor 30. The entire assemblage is attached to an electrically insulating supporting mount 40.

In this preferred embodiment, the beam extraction voltage preferably is selected according to the type of ultra thin film material used for the electron window 12, since, as is known to those skilled in the arts, transparency is energy dependent. After passage through the electron window 12, the beam 34 can subsequently be accelerated or decelerated as needed to a target-relative voltage in the range of about 20 to 1,000 volts.

Figure 2:
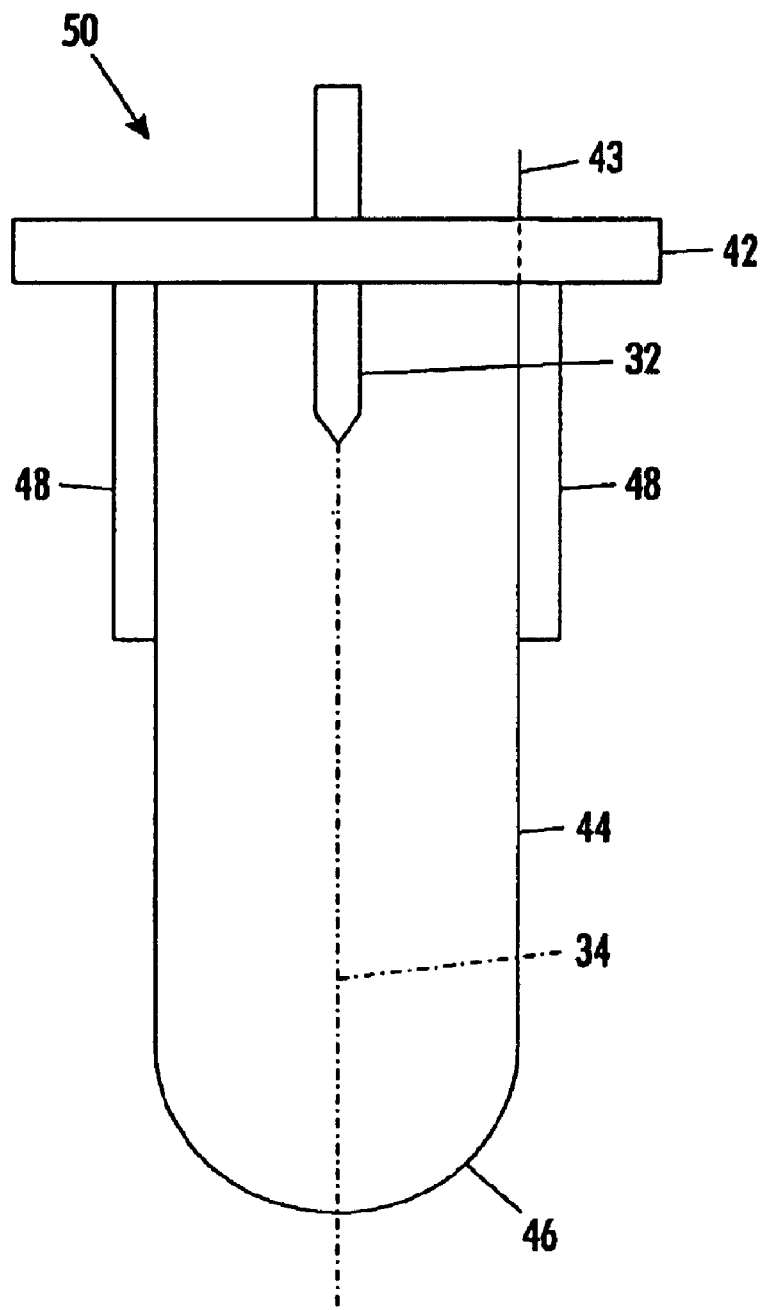
FIG. 2 is a schematic representation of another embodiment of an enclosed point source electron beam generator.

FIG. 2 illustrates another configuration of a tip assembly 50 in which tip 32 is in the shape of a carbon nanotube. In this embodiment, tip 32 has a relatively small diameter, in the range of 0.3 to 10 nanometers. In this embodiment, the carbon nanotube may be composed of single or multi-walled metallic-type carbon nanotube; alternatively, it may be composed of tungsten mono-atomic point emitter or other suitable material.

Referring again to FIG. 2, the tip 32 is preferably embedded in a support structure 42, which also serves as a thermal sink and ultra-high vacuum seal to a superconducting single walled metallic-type carbon nanotube 44 of relatively larger diameter (in the range, e.g., of approximately 5 to 200 nanometers), which also serves as a field emission extraction electrode and as a miniature ultra-high vacuum chamber. Electrical lead 43 passes through the support structure 42 to provide a means for creating an electrical potential difference between tip 32 and wall 44. In this embodiment, the electron beam 34 emerges from the field emitter 32 and is confined and focused by the superconducting nanotube. 44. Since the momentum of the electrons in beam 34 is largely parallel to the wall 44, relatively little force is required to confine it within wall 44. This beam penetrates and emerges from the semispherical end cap 46. This end cap is less strongly superconducting, or may not be superconducting at all, than the rest of the carbon nanotube 44. Since the momentum of the electron beam 34 is perpendicular to the middle of end cap 46, the middle of end cap 46 serves as an electron window for certain material-dependent electron beam energies. An optional coating of material 48, which may optionally be superconducting, may be used for purposes of vacuum sealing, enhanced mechanical strength, or enhanced superconducting focusing of electron beam 34. In another embodiment (not shown), coating 48 may be connected to the electrical lead 43 and is then used as an electron extraction electrode, instead of nanotube 44.

Figure 3:
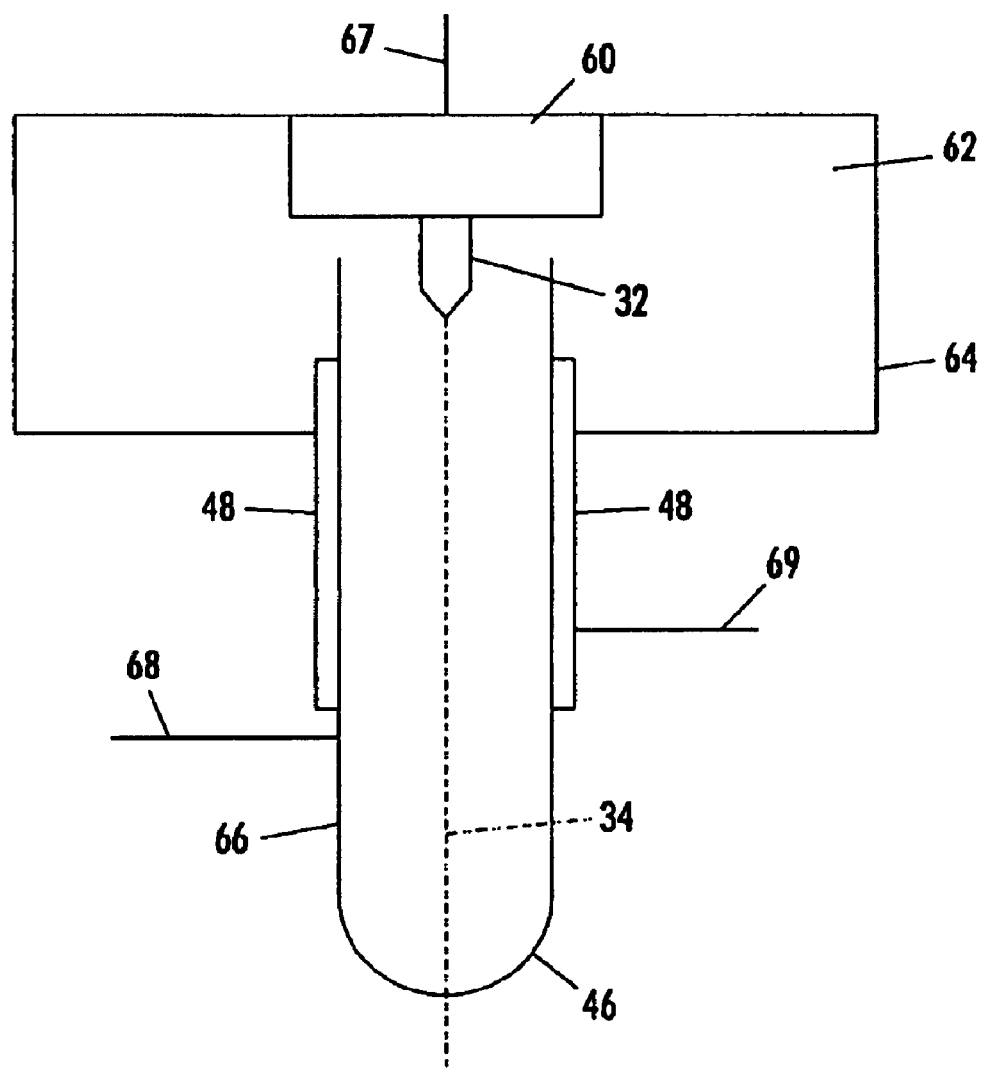
FIG. 3 is a schematic representation of another embodiment of an enclosed point source electron beam generator.

FIG. 3 illustrates another preferred embodiment of this invention. In this configuration, a fixed or dynamic emitter tip positioning system 60 is enclosed in a miniature ultra high vacuum chamber 62 and support structure 64. The tip 32 preferably has a relatively small diameter, e.g. in the range of approximately 0.3 to 10 nanometers; single walled metallic-type carbon nanotube 32 serves as an atomic point source field emitter of electrons 34. Alternatively, the atomic point source field emitter 32 may be a multi-walled carbon nanotube or a tungsten mono-atomic point emitter or other suitable material. This electron emitter 32 is embedded in a positioning system 60. The support structure 64 also serves as a thermal sink and ultra-high vacuum seal to a superconducting single walled metallic-type carbon nanotube 66 of relatively larger diameter, e.g. in the range of approximately 5 to 200 nanometers, which serves both as a field emission extraction electrode and as a miniature ultra-high vacuum chamber. The electron beam 34 emerges from the field emitter 32 and is confined and focused by the superconducting nanotube 66. The electron beam 34 penetrates the semispherical end cap 46 and emerges from the end of it. This end cap is less strongly superconducting or may not be superconducting at all. Since the momentum of the electron beam is perpendicular to the end cap 46 it serves as an electron window. An optional coating of material 48, optionally superconducting, may be used for purposes of vacuum sealing, enhanced mechanical strength, or enhanced superconducting focusing of the electron beam. In the embodiment depicted in FIG. 3, electrical leads 67, 68 are connected to a voltage supply (not shown), which provides the electrical potential difference between the tip 32 and the field emission extraction electrode 66. Alternatively, an optional electrical lead 69 may be connected to a voltage supply (not shown) when the optional coating of material 48 is to be utilized as the field emission extraction electrode.

The relatively larger single walled carbon nanotubes in FIGS. 2 and 3 may be quite long compared to their diameter, e.g. on the order of a micron or more; in general, such nanotubes have aspect ratios of at least about 1:10 to 1:1000. The material properties (such as toughness and springiness of such nanotubes) may be adapted to allow the nanotubes to optionally be subjected to mechanical bending involving various high frequency resonant motion patterns, in the kilohertz through megahertz range, depending on specific geometry for purposes of directing, diverting, modulating, or scanning the emergent electron beam.

There are several forms of carbon nanotubes. In general, the most commonly studied forms of carbon nanotubes have physical properties such that they conduct electricity better than copper, they have a tensile strengths over 100 times that of steel, they become superconductors when cooled to extremely low temperatures, and they are exceptionally tough and resilient when subjected to mechanical bending.

The electron transparent structures illustrated in the Figures can be formed by the carbon nanotube end caps 46 shown in FIGS. 2 and 3. Alternatively, or additionally, these electron transparent structures may be replaced, in part or in whole, by mechanically attaching some other ultra thin film of suitably electron transparent material to the end of an uncapped carbon nanotube.

The micro-enclosed point source electron beam generators 10 of FIG. 1 and 32 of FIGS. 2 and 3 may be mechanically scanned near the target to be imaged or incorporated into the tip of an atomic force microscope for the purpose of very high resolution electron microscopy and spectroscopy; or such point source electron beam generators 10 of FIG. 1 and 32 of FIGS. 2 and 3 can be incorporated into an electron beam micro-column, such as described in "Fabrication of electron-beam microcolumn aligned by scanning tunneling microscope", Jeong-Young Park, et al, Journal of Vacuum Science and Technology A, Volume 15, Number 3, May/June 1997, 1499–1502.

Figure 10:
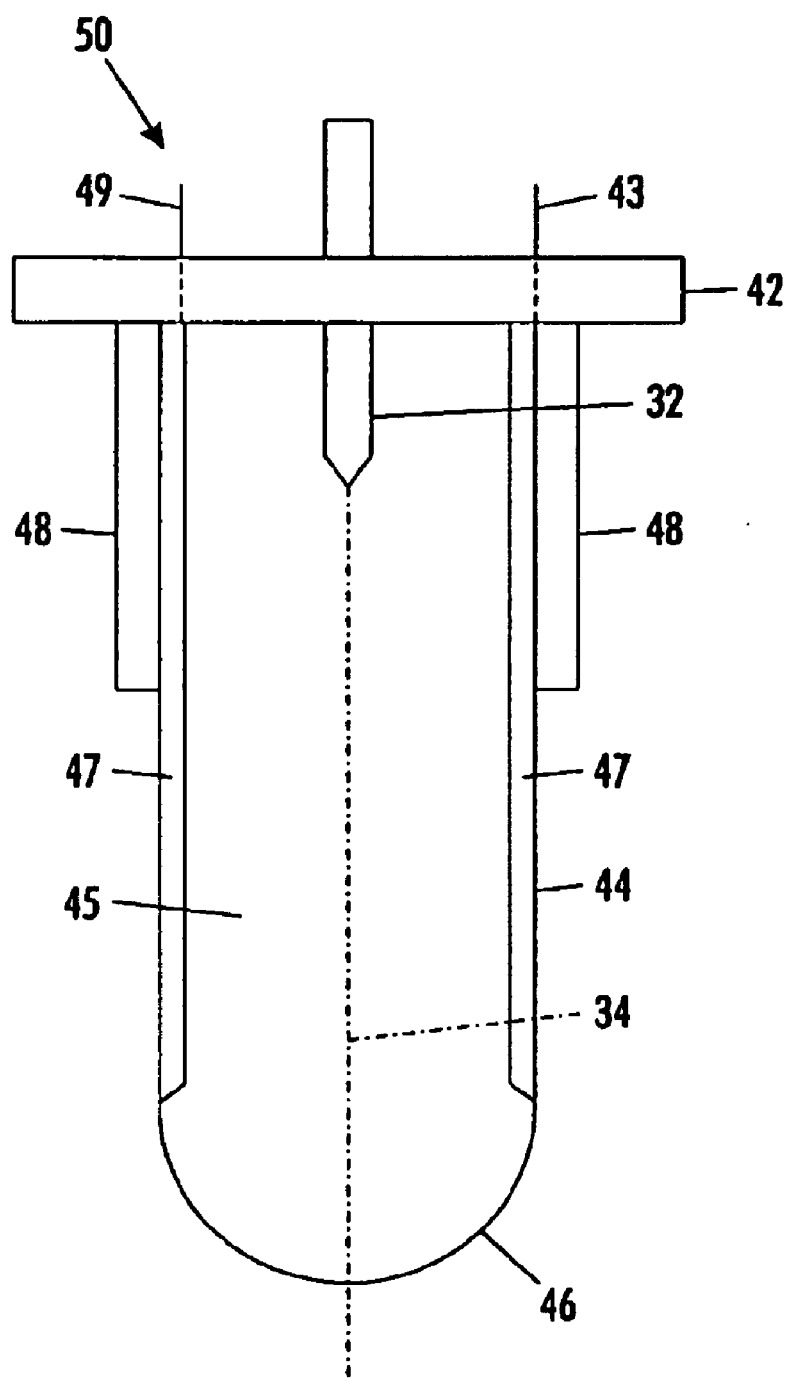
FIG. 10 is a schematic representation of another embodiment of an enclosed point source electron beam generator.

FIG. 10 is a schematic representation of another embodiment of an enclosed point source electron beam generator. Referring to FIG. 10, and in the preferred embodiment depicted therein, there is illustrated another configuration of a tip assembly 50 in which tip 32 is in the, shape of carbon nanotube. In this embodiment, tip 32 has a relatively small diameter, in the range of 0.3 to 10 nanometers. In this embodiment, the carbon nanotube may be composed of single or multi-walled metallic-type carbon nanotube; alternatively, it may be composed of tungsten mono-atomic point emitter or other suitable material. Referring again to FIG. 10, the tip 32 is preferably embedded in a support structure 42, which also serves as a thermal sink and ultra-high vacuum seal to a superconducting single walled metallic-type carbon nanotube 44 of relatively larger diameter (in the range, e.g., of approximately 5 to 200 nanometers), which also serves as a field emission extraction electrode and as a miniature ultra-high vacuum chamber. Electrical lead 43 passes through the support structure 42 to provide a means for creating an electrical potential difference between tip 32 and wall 44. In this embodiment, the electron beam 34 emerges from the field emitter 32 and is confined and focused by the superconducting nanotube 44. Since the momentum of the electrons in beam 34 is largely parallel to the wall 44, relatively little force is required to confine it within wall 44. This beam penetrates and emerges from the semispherical end cap 46. This end cap is less strongly superconducting, or may not be superconducting at all, than the rest of the carbon nanotube 44. Since the momentum of the electron beam 34 is perpendicular to the middle of end cap 46, the middle of end cap 46 serves as an electron window for certain material-dependent electron beam energies. An optional coating of material 48, which may optionally be superconducting, may be used for purposes of vacuum sealing, enhanced mechanical strength, or enhanced superconducting focusing of electron beam 34. In another embodiment (not shown), coating 48 may be connected to the electrical lead 43 and is then used as an electron extraction electrode, instead of nanotube 44.

In this preferred embodiment, a very thin film coating 47 comprising a conducting material, e.g. silver, copper, titanium, gold, etc. is applied to the inner surface of superconducting nanotube 44. The conductivity of thin film coating 47 is relatively small in comparison to the conductivity of superconducting nanotube 44. As such, thin film 47 is "magnetically invisible" to electron beam 34. Thin film coating 47 has sufficient magnetic strength, however, to remove low energy, off axis electrons from electron beam 34. Concurrently, thin film coating 47 geometrically reduces the average effective vacuum tunneling gap, (which is the distance from a beam particle to a conductor) of superconducting nanotube 44, thus keeping electron beam 34 highly coherent and focused. Connector 49 is connected to a power supply (not shown), which provides an electrical potential to thin film coating 47.

Figure 11:
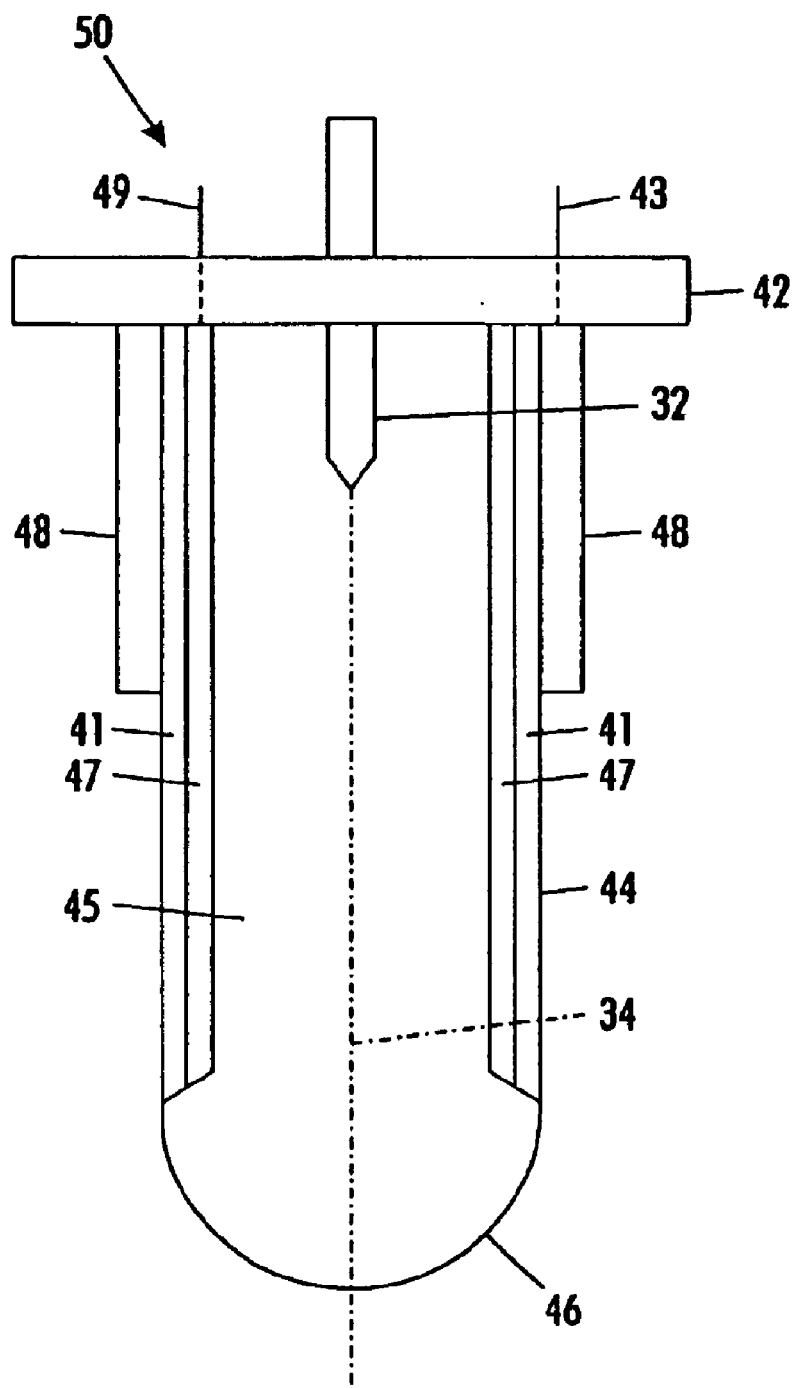
FIG. 11 is a schematic representation of another embodiment of an enclosed point source electron beam generator.

FIG. 11 illustrates another preferred embodiment of this invention. In this embodiment, a thin, insulating film 41 is disposed between the inner surface of superconducting nanotube 44 and conductive thin film coating 47.

Figure 12:
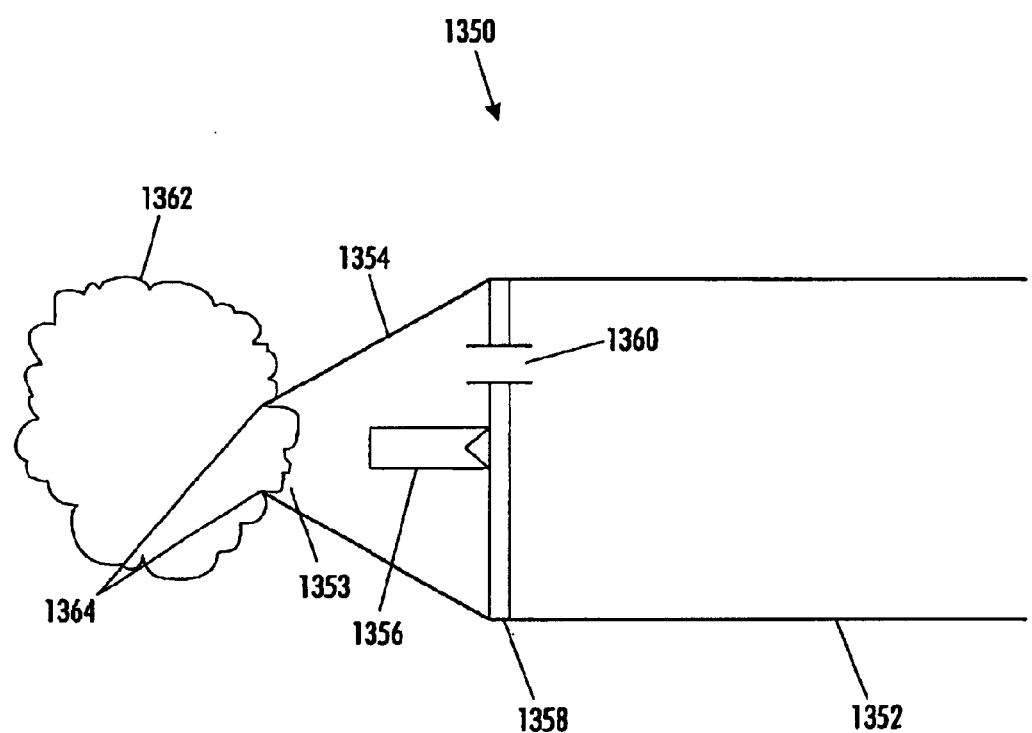
FIG. 12 is a schematic representation of an enclosed pico-SEM (Scanning Electron Microscope) comprising an enclosed point source electron beam generator.

FIG. 12 is a schematic representation of an enclosed pico-SEM (Scanning Electron Microscope) comprising a carbon nanotube point source of electrons, which may be comprised of any of the systems shown in FIGS. 1, 2, 3, 10 or 11 and previously described in this specification. Miniature pico-SEM having working distances less than the mean free path for air, and can operate at low to medium vacuum. Referring to FIG. 12, device 1350 comprises an enclosed point source electron beam generator 1356, which is preferably a carbon nanotube point source of electrons previously described in this specification.

Device 1350 may be used to scan external and internal cell membranes and embedded, non-channel molecular structures, microtubule surfaces, and other biological features of interest in their native state. Device 1350 further comprises a conically tapered enclosure 1354 having a proximal end 1353 and a distal end 1355. The proximal end of conical tapered enclosure 1354 is attached to a vacuum tube 1352 through supporting member 1358. Supporting member 1358 has an opening 1360, which provides a connection to vacuum tube 1352. The distal end 1355 of conically tapered enclosure 1354 comprises conical pipette tip target opening 1364 having a diameter ranging from about 10 nanometers to about 300 nanometers. Conical pipette tip target opening 1364 is coated with a watertight sealant. Device 1350 may be steered into position so that opening 1364 may become in contact with surface 1362 of specimen to be scanned by pico-SEM 1356. A portion of surface 1362 may extend into the conically tapered enclosure 1354 through opening 1364 by capillary action. The pressure inside conically tapered enclosure 1354 may be regulated by varying the pressure inside vacuum tube 1352 to counteract the capillary action. The distance from pico-SEM 1356 to surface 1362 may be adjusted by varying the backpressure provided by vacuum tube 1352.

Figure 4:
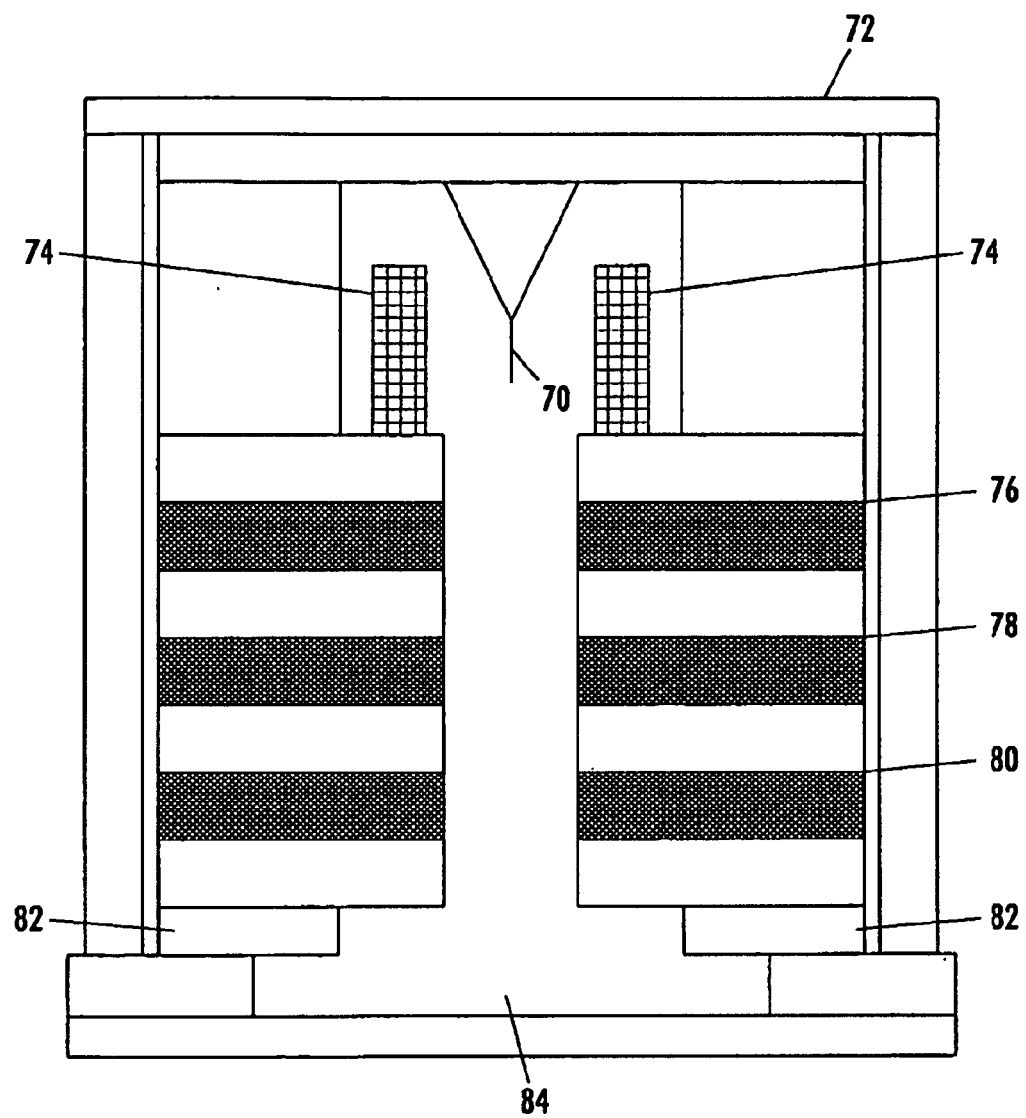
FIG. 4 is a schematic representation of a miniature scanning electron microscope using an enclosed point source electron beam generator.

FIG. 4 illustrates the use of a micro-enclosed point source of electrons 70, (which may consist of any of the systems shown in FIGS. 1, 2, and 3) to substantially improve on other devices, such as, e.g., the device disclosed in Thomas George's "Miniature Electron Microscopes Without Vacuum Pumps", NASA Technical Brief, Vol. 22, No. 8. (JPL NEW TECHNOLOGY REPORT NPO-20335). A low-to-medium vacuum enclosure 72 contains the whole system; in general, the pressure within enclosure 72 is from about $10^{-3}$ to $10^{-6}$ Torr. An optional superconducting cylinder 74 can be used for narrowing the conical emerging electron beam. An optional beam extraction electrode and/or beam acceleration or deceleration electrodes 76 may be used. Electrode pair 78 and electrode 80 are used for scan deflection and focus. Backscattered electron detectors 82 are placed above the observation and manipulation stage 84. Secondary and backscattered electrons may be detected either by a micro channel plate, or a channeltron, or by other conventional means.

Figure 5:
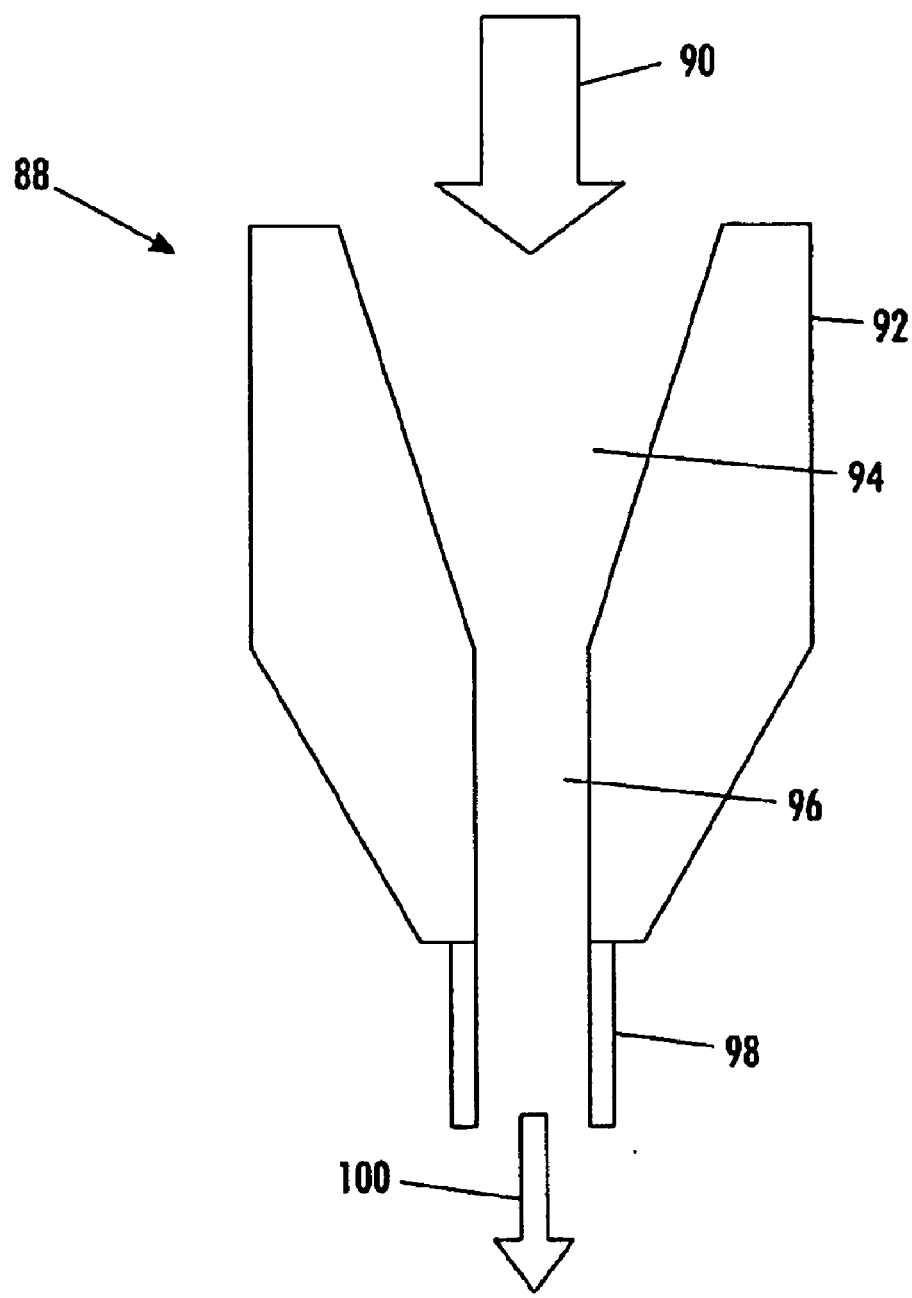
FIG. 5 is a schematic representation of an electron beam focusing coupler for a superconducting nano-channel.

The use of superconducting channels for manipulating electron beams has been described in "High Tc bulk superconductor wigglers", Hidenori Matsuzawa, et al, Applied Physics Letters, Volume 59, Number 2, 8 Jul. 1991, 141–142. FIG. 5 shows how a relatively large (in the range of approximately 0.1 to 100 micron diameter) beam of electrons or positive ions 90 may be narrowed into a beam 100 by means of a superconducting channel assembly 88. Beam 90 passes through superconducting material 92 with a converging funnel channel 94 to a channel 96 of dimensions in the range of approximately 1 to 100 nanometer diameter, and through a connected single walled superconducting carbon nanotube 98. The superconducting structure 92 may optionally be split in planes perpendicular to the funnel axis into several mutually insulating segments that are mutually electrified so as to facilitate the attraction of electrons into each successive segment.

Figure 6:
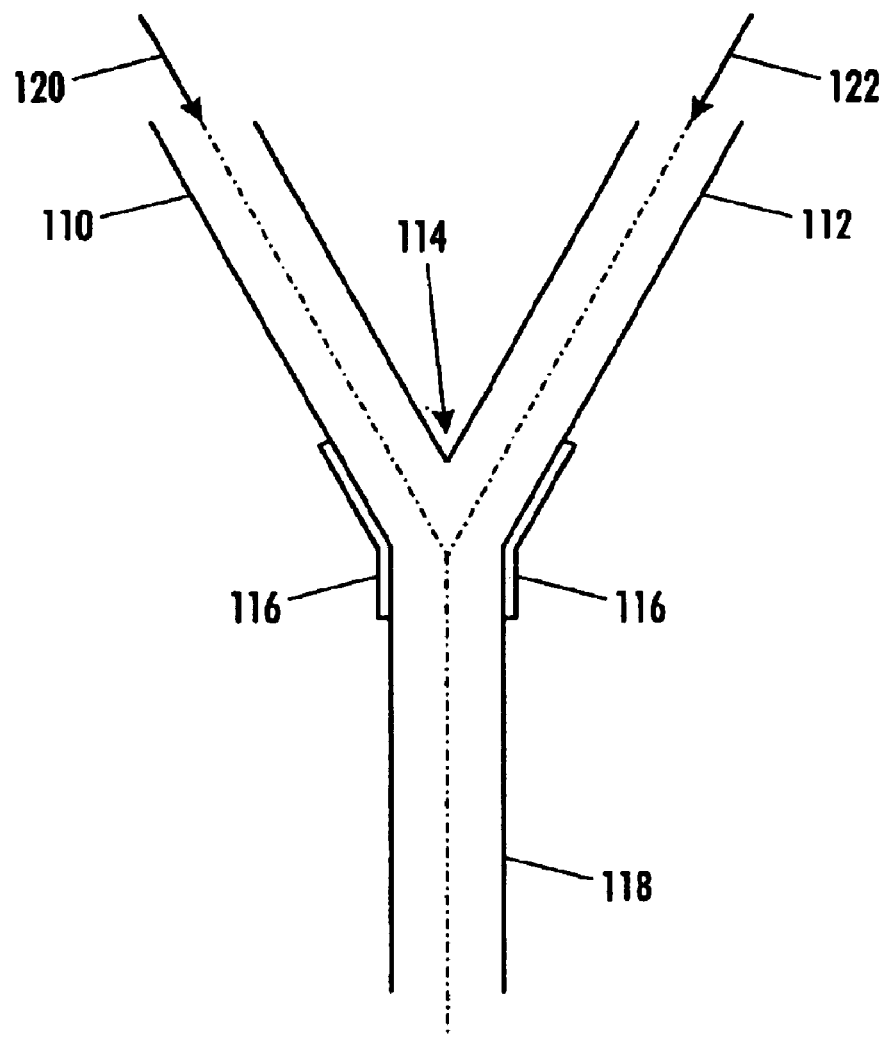
FIG. 6 is a schematic representation of a superconducting nano-channel Y junction.

FIG. 6 illustrates the use of superconducting carbon nanotubes 110, 112 in the range of about 0.3 to 100 nanometers in diameter constructed into a Y-junction 114. Because superconductivity is likely substantially reduced in the junction region itself, this region would normally be externally coated with a thin film of superconducting material 116. The more general use of high temperature superconductors for such coatings and the coating of all channels removes the requirement that the carbon nanotubes be superconducting or be used at the temperature at which they are superconducting. This system can be used to couple an electron beam 120 with an ion beam 122 or with another source of electrons at a different energy level, from inlets 110, 112 into the Y-junction 114 and to the single coaxial outlet 118. One of several means of using such a system is to use the electron beam for target illumination and positioning purposes, and using the ion beam for transient milling or ion deposition purposes.

Figure 7:
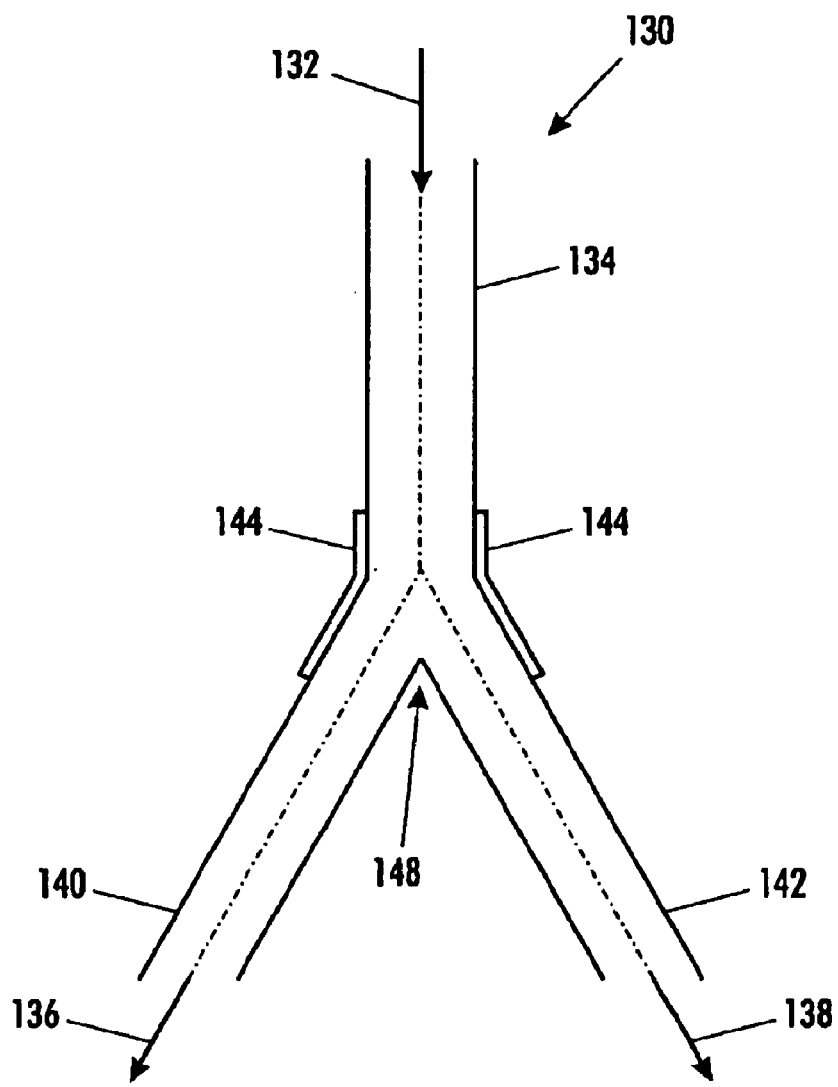
FIG. 7 is a schematic representation of a superconducting nano-channel Y junction.

Alternatively, the Y-junction assembly 130 shown in FIG. 7 can be used to split an electron beam 132 entering inlet 134 into 2 beams 136, 138 exiting at outlets 140, 142. Additional thin film coating 144 of a superconducting material may optionally be employed to enhance the superconducting property at the junction 148. Such junctions need not be symmetric in branching angles or in terms of nanotube diameters. Multiple such splitting and merging junctions may be combined in practice, and may be structured so as to implement nano-scale electron beam analogs of fluidic technology, including feedback loops. Modulation mechanisms may be provided by external pulsed magnetic fields above the local superconducting shielding level, induction of trapped magnetic fields inside and along the axis of nano-channel loops, locally induced transient thermal excursions above the superconducting threshold temperature, mechanical bending, and the use of electrically insulated superconducting channel segments at differing potentials. These can be used in vacuum electronic device systems that dispense with individual solid state cathodes and individual solid state anodes. Such systems can also be realized without using carbon nanotubes, by exploiting the fabrication techniques that are used for micro-electro-mechanical systems. Such device systems can implement analog and digital types of transducer, signal processing, and computing functions. The highly modulated electron beam output of such systems can be used for subsequently miniaturized electron microscopy implementation, and for corollary use in spatially resolved electrochemistry processes.

Figure 8:
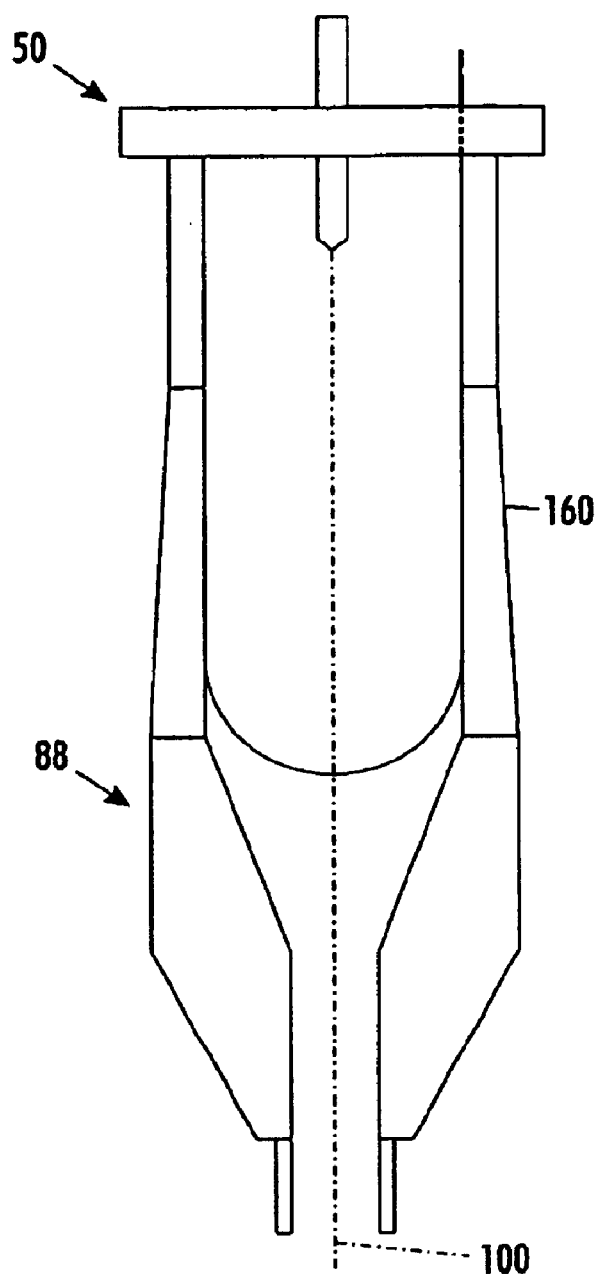
FIG. 8 is a schematic representation of a point source electron beam generator coupled to an electron beam focusing superconducting nano-channel.

FIG. 8 illustrates one preferred use of the electron beam emitter assembly 50 of FIG. 2 together with the superconducting channel assemble 88 of FIG. 5. A material 160 is used to attach assembly 50 to the assembly 88. In one embodiment, material 160 is a non-conducting material, e.g. Nylon-6, Nylon-66, Teflon or the like, and electrically isolates assembly 50 from assembly 88. In another embodiment, material 160 is a superconducting material.

Figure 9:
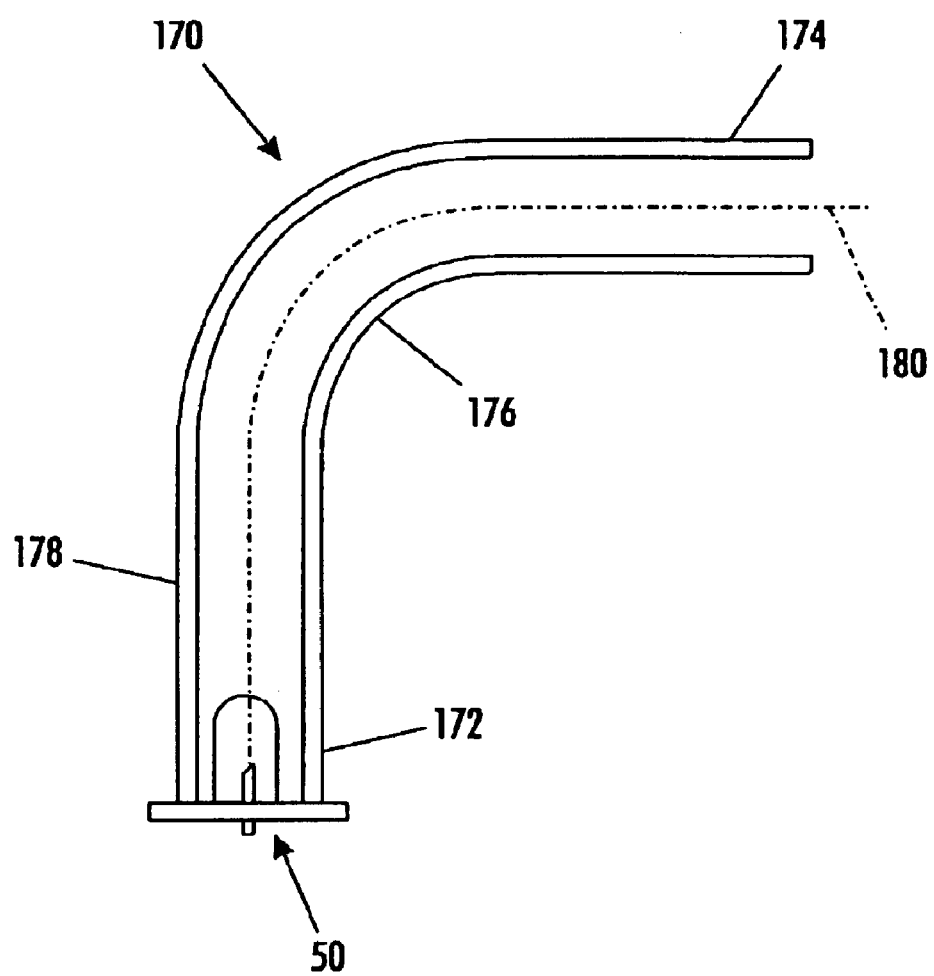
FIG. 9 is a schematic representation of a point source electron beam generator coupled to a superconducting nano-channel.

Free standing flexible superconducting nanometer scale tubes and fixed superconducting nanometer scale channels formed on supporting substrates, manufactured by means well known to those skilled in the art of micro-lithography and related micro-fabrication techniques, may be used for conveying coherent electron beams with energies corresponding to wavelengths of a similar order of magnitude (e.g. a few electron volts) and provides a nanometer scale electron beam analog of micron scale fiber optical systems. FIG. 9 illustrates a preferred embodiment in which an electron beam emitter assembly 50 of FIG. 2 is coupled to superconducting channel 170 for conveyance of a coherent electron beam 180. Referring to FIG. 9, superconducting channel 170 consists of a superconducting material 178 in the form of a tube. At one end 172 of channel 170 is attached the electron beam source 50. The electron beam 180 passes through a 90 degree bend 176 in the channel 170 and exits at the channel end 174.

It is, therefore, apparent that there has been provided, in accordance with the present invention, an improved microscopy probe comprising a carbon-based nanotube having a nanometer scale tip disposed within a first vacuum chamber. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. An apparatus for producing an electron beam, comprising:
    (a) a support structure;
    (b) a miniature ultrahigh vacuum chamber comprising a superconducting single walled metallic-type carbon nanotube comprised of a cylindrical wall, a proximal end disposed upon and sealed to said support structure, and a distal end comprising an electron-transparent structure;
    (c) an electron beam emitting tip comprising a second carbon nanotube embedded in said support structure and disposed within said superconducting single walled metallic-type carbon nanotube, said second carbon nanotube having an inner surface with a thin conductive coating disposed thereupon; and
    (d) means for creating an electrical potential difference between said electron beam emitting tip and said cylindrical wall of said superconducting carbon nanotube.

2. The apparatus as recited in claim 1, wherein said thin conductive coating is selected from the group consisting of silver, copper, gold, titanium, and mixtures thereof.

3. The apparatus as recited in claim 1, wherein said electron beam emitting tip further comprises an insulating film disposed between said inner surface of said second carbon nanotube and said thin conductive coating.

4. The apparatus as recited in claim 1, wherein said means for creating an electrical potential difference between said electron beam emitting tip and said cylindrical wall of said superconducting carbon nanotube comprises an electrical lead passing through said support structure to said cylindrical wall of said superconducting carbon nanotube.

5. The apparatus as recited in claim 1, wherein said electron-transparent structure of said distal end of said superconducting single walled metallic-type carbon nanotube comprises a semispherical end cap.

6. The apparatus as recited in claim 1, wherein said second carbon nanotube has a diameter between 0.3 and 10 nanometers.

7. The apparatus as recited in claim 6, wherein said second carbon nanotube is a single walled metallic type carbon nanotube.

8. The apparatus as recited in claim 6, wherein said second carbon nanotube is a multi-walled metallic type carbon nanotube.

9. The apparatus as recited in claim 1, wherein said superconducting single walled metallic-type carbon nanotube has a diameter between 5 and 200 nanometers.

10. The apparatus as recited in claim 9, wherein said superconducting single walled metallic-type carbon nanotube has a diameter between 10 and 200 nanometers and said second carbon nanotube has a diameter between 0.3 and 5 nanometers.

11. The apparatus as recited in claim 1, wherein said superconducting single walled metallic-type carbon nanotube has an aspect ratio of diameter:length of at least about 1:10 to 1:1000.

12. A scanning electron microscope comprising an enclosed point source electron beam generator disposed within a conically tapered enclosure having a proximal end and a distal end, said proximal end in communication through an opening therein with a vacuum tube, and said distal end comprising a conical pipette tip target opening.

13. The apparatus as recited in claim 12, wherein said enclosed point source electron beam generator comprises a support structure, and a first carbon nanotube disposed upon and sealed to said support structure.

14. The apparatus as recited in claim 13, wherein said enclosed point source electron beam generator further comprises a second carbon nanotube embedded in said support structure and disposed within said first carbon nanotube.

15. The apparatus as recited in claim 14, wherein said second carbon nanotube has a diameter between 0.3 and 10 nanometers.

16. The apparatus as recited in claim 14, wherein said second carbon nanotube is a single walled metallic type carbon nanotube.

17. The apparatus as recited in claim 14, wherein said second carbon nanotube is a multi-walled metallic type carbon nanotube.

18. The apparatus as recited in claim 13, wherein said first carbon nanotube comprises a semispherical end cap.

19. The apparatus as recited in claim 12, wherein said conical pipette tip target opening has a diameter ranging from about 10 nanometers to about 300 nanometers.

20. The apparatus as recited in claim 12, wherein said conical pipette tip target opening is coated with a watertight sealant.

* * * * *